United States Patent
Goushcha et al.

(10) Patent No.: US 8,101,981 B2
(45) Date of Patent: Jan. 24, 2012

(54) BACK-ILLUMINATED, THIN PHOTODIODE ARRAYS WITH ISOLATING ETCHED TRENCHES BETWEEN ELEMENTS

(75) Inventors: Alexander O. Goushcha, Aliso Viejo, CA (US); George Papadopoulos, Newport Beach, CA (US); Perry A. Denning, Irvine, CA (US)

(73) Assignee: Array Optronix, Inc., San Francisco, CA (US)

( * ) Notice: Subject to any disclaimer, the term of this patent is extended or adjusted under 35 U.S.C. 154(b) by 0 days.

(21) Appl. No.: 12/188,829

(22) Filed: Aug. 8, 2008

(65) Prior Publication Data
US 2009/0057801 A1    Mar. 5, 2009

Related U.S. Application Data

(60) Provisional application No. 60/964,331, filed on Aug. 10, 2007.

(51) Int. Cl.
*H01L 31/062* (2012.01)
(52) U.S. Cl. ......... 257/292; 257/290; 257/291; 257/293
(58) Field of Classification Search ........... 257/E31.058, 257/E31.063, E31.115, E25.032, E27.133–E27.139, 257/233, 292, 431–466; 438/48, 54, 65, 438/69, 70
See application file for complete search history.

(56) References Cited

U.S. PATENT DOCUMENTS

| | | | |
|---|---|---|---|
| 3,748,546 A * | 7/1973 | Allison | 257/435 |
| 6,426,991 B1 | 7/2002 | Mattson et al. | |
| 6,707,046 B2 | 3/2004 | Possin et al. | |
| 6,762,473 B1 | 7/2004 | Goushcha et al. | |
| 6,933,489 B2 | 8/2005 | Fujii et al. | |
| 7,112,465 B2 | 9/2006 | Goushcha et al. | |
| 7,242,069 B2 * | 7/2007 | Bui et al. | 257/443 |
| 7,592,644 B2 * | 9/2009 | Suzuki et al. | 257/184 |
| 2002/0187581 A1 * | 12/2002 | Yang | 438/48 |
| 2005/0221541 A1 | 10/2005 | Metzler et al. | |
| 2006/0038254 A1 | 2/2006 | Jin | |
| 2006/0049437 A1 * | 3/2006 | Hwang | 257/292 |
| 2006/0094151 A1 | 5/2006 | Sumi | |
| 2006/0186505 A1 * | 8/2006 | Adkisson et al. | 257/463 |

FOREIGN PATENT DOCUMENTS
EP    1 548 836    6/2005
JP    2005-150521    6/2005

OTHER PUBLICATIONS

"International Search Report and Written Opinion of the International Searching Authority Dated Nov. 11, 2008", International Application No. PCT/US2008/072716.
Office Action dated Jun. 15, 2011, in Chinese Patent Application No. 200880111422.9, filed Aug. 8, 2008.
Amendment dated Jan. 14, 2011, in European Application No. 08797559.5, filed Aug. 8, 2008.

* cited by examiner

*Primary Examiner* — Wai Sing Louie
*Assistant Examiner* — Bilkis Jahan
(74) *Attorney, Agent, or Firm* — Vierra Magen Marcus & DeNiro LLP (57) ABSTRACT

Back-illuminated, thin photodiode arrays with trench isolation. The trenches are formed on one or both sides of a substrate, and after doping the sides of the trenches, are filled to provide electrical isolation between adjacent photodiodes. Various embodiments of the photodiode arrays and methods of forming such arrays are disclosed.

12 Claims, 10 Drawing Sheets

BACK-ILLUMINATED, THIN PHOTODIODE ARRAYS WITH ISOLATING ETCHED TRENCHES BETWEEN ELEMENTS

CROSS-REFERENCE TO RELATED APPLICATION

This application claims the benefit of U.S. Provisional Patent Application No. 60/964,331 filed Aug. 10, 2007.

BACKGROUND OF THE INVENTION

1. Field of the Invention

The present invention relates to structures of the back-illuminated, pin photodiode arrays manufactured on thin wafers and methods of manufacturing the same.

2. Prior Art

The structures described herein can be considered an alternative to the conventional structures described previously in U.S. Pat. Nos. 6,762,473 and 7,112,465, as well as in the number of patents from other inventors. See for example U.S. Pat. Nos. 6,933,489, 6,426,991 and 6,707,046.

Figure 1:
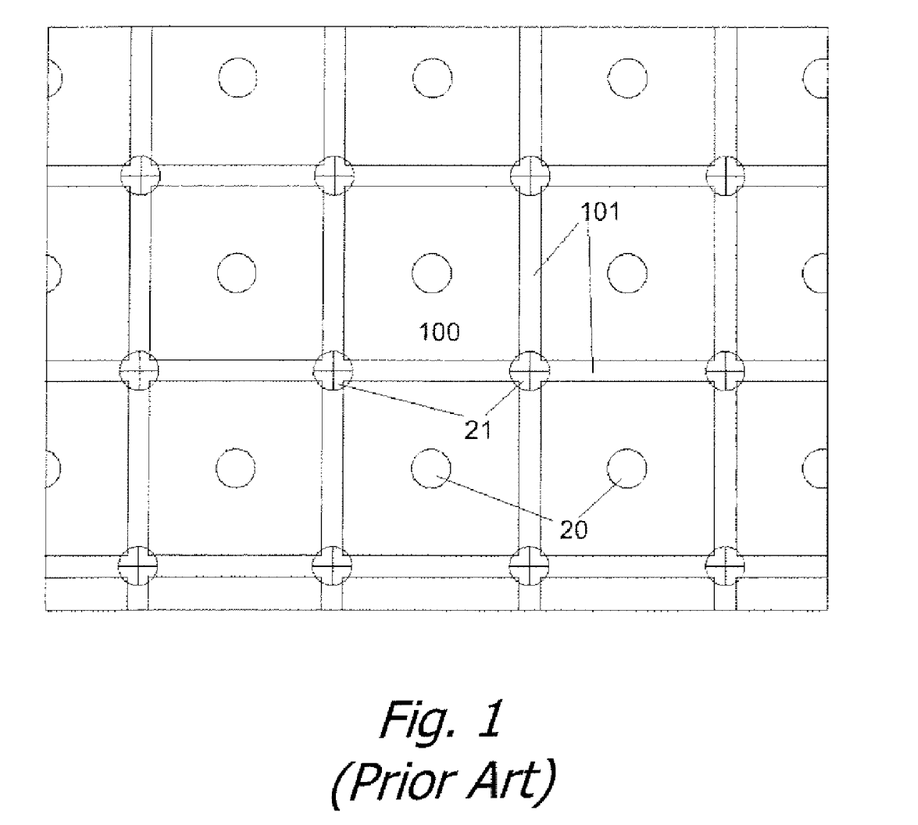
FIG. 1 shows the view from the first (front) surface of a conventional (prior art) pin photodiode array with isolation diffusion applied on the first surface of the substrate.

Pin photodiode arrays for imaging applications are 2D arrays combining multiple pixels separated from each other in one of various different ways. A typical die layout (front view) for the 2D backlit pin photodiode array with isolation diffusion between pixels on the front side is shown in FIG. 1.

Figure 2:
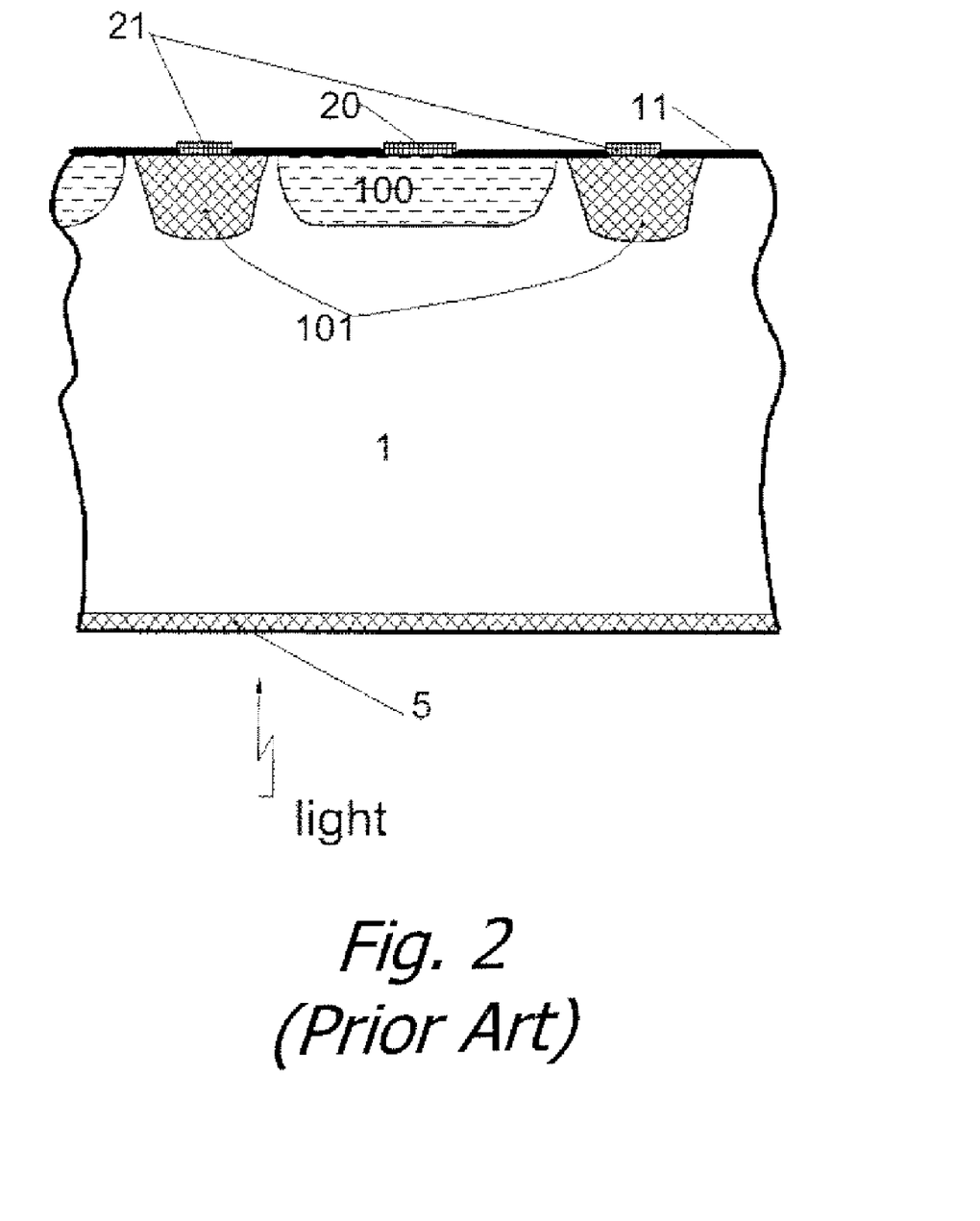
FIG. 2 is the cross section of a typical backlit pin photodiode array (prior art).

In conventional backlit arrays, isolation structures are not usually made on the backside of the array. The example of the vertical structure of such conventional backlit pin photodiode array is shown in FIG. 2. The substrate 1 is a first conductivity type. The active pixel diffusion 100 is of the second conductivity type (polarity is different from that of the substrate). Diffusions 100 form diodes (either p-on-n or n-on p polarity) with p-n junctions in the substrate. The diffusion 101 between pixels is of the same conductivity type as the substrate (the first conductivity type). The diffusions 100 and 101 are usually shallow. The shallow blanket diffusion 5 is of the first conductivity type. Oxide layer 11 is a thermal oxide or other passivation layer. The anode pads 20 and cathode pads 21 complete the structure.

Figure 3:
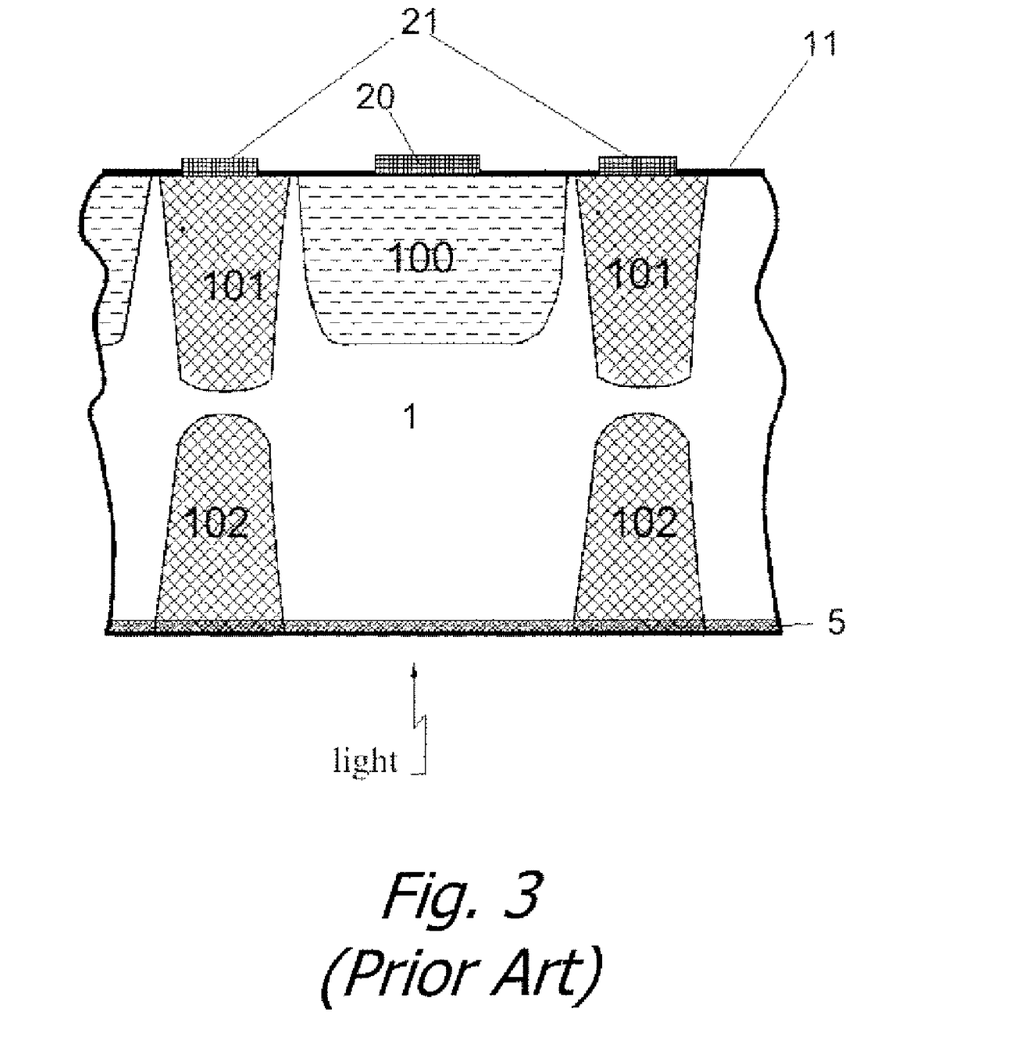
FIG. 3 is an example of a prior art backlit pin photodiode array with isolation diffusion applied from the both surface of the substrate.

FIG. 3 shows an example of the structure for backlit pin photodiode arrays with isolation diffusion applied from both sides of the wafer (see also U.S. Pat. Nos. 6,762,473 and 7,112,465). In addition to the structure shown in FIG. 3, an additional feature—the isolation diffusion 102 from the backside is applied. The diffusion 102 is of the first conductivity type and is aligned with the diffusion 101 and other structural features on the front side. The diffusions 101 and 102 may or may not meet in the bulk of the wafer. The diffusion 100 may be shallow or as deep as the diffusion 101.

The structure shown in FIG. 3 is characterized with superior performance parameters, such as leakage current, crosstalk between active pixels of the array, response time, and others.

BRIEF DESCRIPTION OF THE DRAWINGS

The main ideas of the invention are demonstrated by the accompanying drawings, in which.

DETAILED DESCRIPTION OF THE PREFERRED EMBODIMENTS

The objectives of the present invention include:

1) To provide multiple element, backside illuminated pin photodiode arrays with a superior performance of all elements;

2) To provide fabrication methods for the backside-illuminated photodiode array on an ultra thin wafer.

It is therefore an object of this invention to provide a structure for 2-D pin photodiode arrays having superior performance characteristics, making it useful in such applications as CT scanner applications, etc.

Another object is to provide a method of fabricating Si devices on thin wafers, which method can be suitable for fabrication of flip-chip, multi-element, 2-dimensional pin photodiode arrays.

These and other objects of the present invention will become apparent from the following disclosure. In this disclosure, first preferred embodiments of the arrays structures will be described, and then the preferred method of fabricating the arrays will be described.

The embodiments of the present invention are shown in and described with respect to FIGS. 4 through 8.

Figure 4:
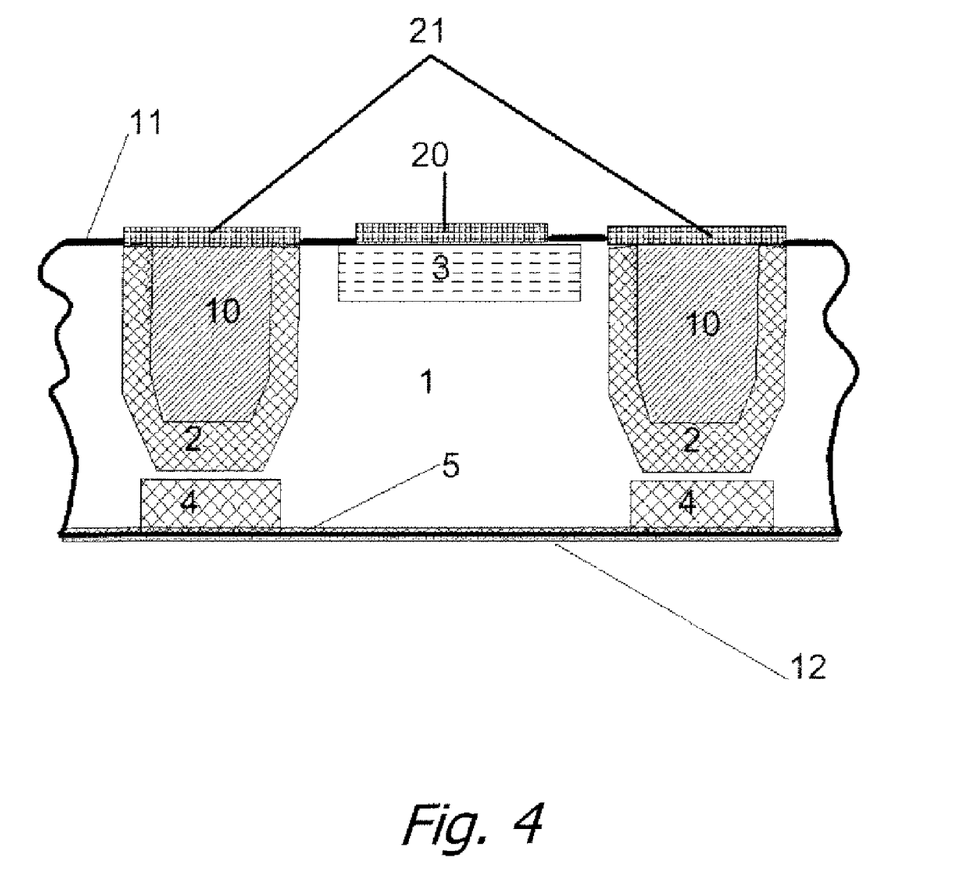
FIG. 4 shows the cross section of an exemplary structure with front side trenches and backside isolation diffusion in accordance with the present invention.

FIG. 4 shows a first example of a structure in accordance with the present invention.

Figure 5A:
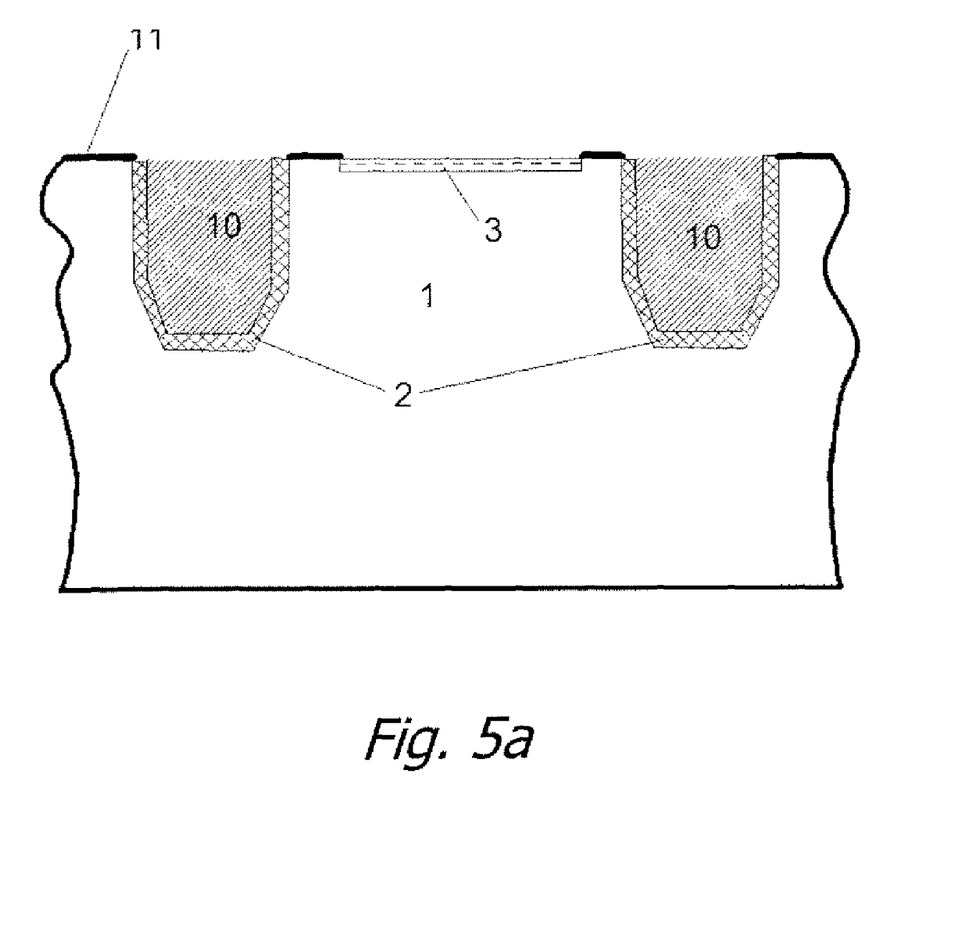
FIGS. 5a through 5c illustrate an exemplary fabrication sequence for the structure shown in FIG. 4.
Figure 5B:
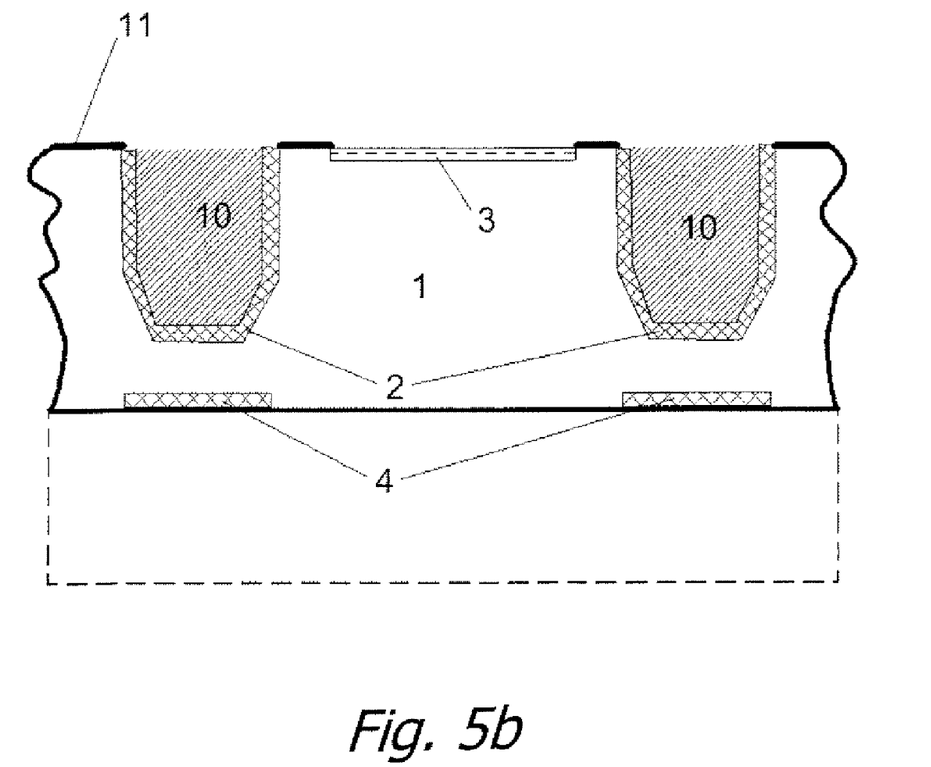
Figure 5C:
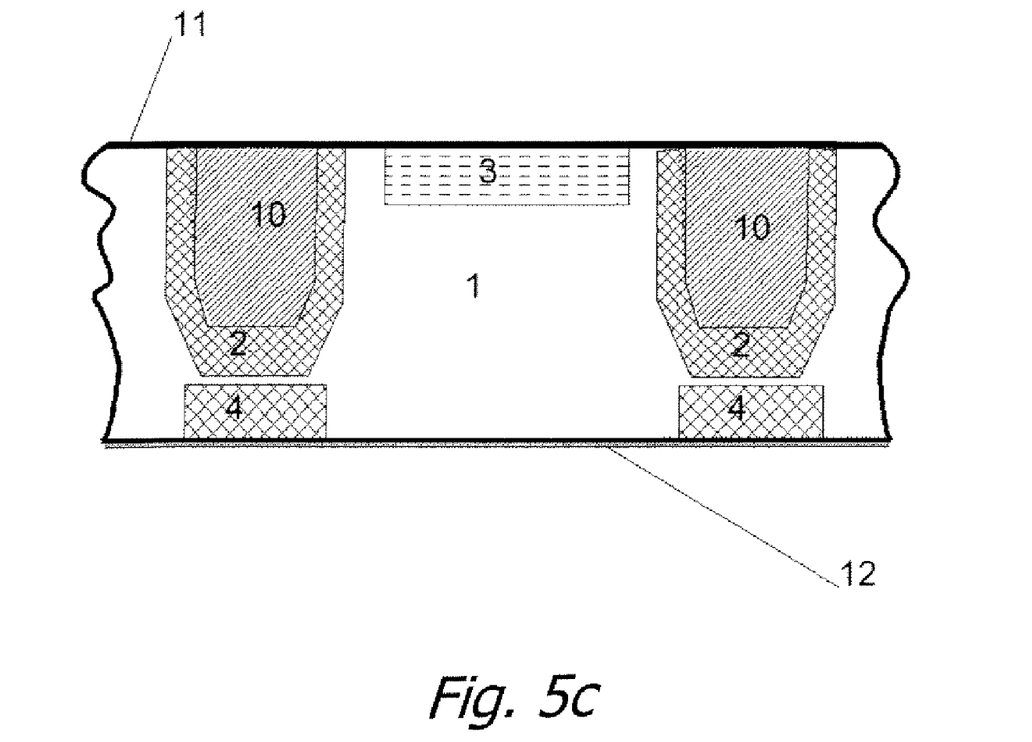

FIGS. 5a through 5c show the steps of and exemplary fabrication method of the structure of FIG. 4.

The structure in FIG. 4 includes (electrical) isolation trenches 10 on the front side (first surface) and isolation diffusion 4 made from the backside (second surface) of the substrate 1. The pin photodiode array of the structure shown in FIG. 4 is made using semiconductor substrate 1 of a first conductivity type. The basic steps of the fabrication method for the structure of FIG. 4 are disclosed herein with FIGS. 5a through 5c.

As shown in FIG. 5a, deep trenches (defining regions 10) are created in the first surface of the substrate between pixels (active elements) of the array. The trenches form a matrix enclosing (surrounding) each pixel of the array. The trenches may be created using dry etch, wet etch, or other techniques known in the industry, preferably by a substantially directional etch. The trenches may, for example, propagate from the first surface of the substrate into the substrate bulk to a depth ranging from a few microns to more than 100 um. The maximum depth of the trenches depends on the target thickness of the array and requirements of the mechanical integrity of the wafer. The walls and bottoms of trenches are then doped with the dopant 2 of the first conductivity type (same as the substrate) with a concentration heavier than that of the substrate. The trenches are then backfilled with silicon oxide, poly, or other isolation material 10 as shown in FIG. 5a. Chemical-mechanical polishing (CMP) may be applied to improve the surface planarity. The diffusions 3 of the second conductivity type with a concentration greater than that of the substrate is applied in the middle of each pixel. This diffusion creates p/n junctions with the semiconductor substrate. The shape and size of the diffusion 3 may vary, and depend on the required performance parameters, such as active pixel size and gaps between neighboring pixels. Layer 11 shown in FIG. 5a is thermal oxide or other passivation material.

The next step is shown in FIG. 5b, where the wafer is lapped from the backside (second surface of the substrate) to the thickness of approximately 300 um or less, and preferably less than 200 um. This may be followed by polishing and CMP. Temporary wafer bonding to the first surface of the substrate may be necessary before the wafer thinning. After polishing, diffusion 4 of the first conductivity type in a concentration heavier than that of the substrate is made from the second surface of the substrate. Next, a deep thermal drive is applied to bring diffusions 2 and 4 closer to each other and to bring diffusion 3 closer to the second surface of the substrate, as shown in FIG. 5c. The distance between the p/n junction (bottom edge of the diffusion 3) and the second surface of the substrate is preferably made approximately 200 um or smaller. The diffusions 2 and 4 may touch, but this is not a requirement of the invention. The spacing between the diffusions 2 and 4 may be, by way of example, as small as a few microns and as large as several tens of microns. The final spacing between these two diffusions depends on the required array performance parameters (crosstalk, etc.). The anti-reflection coating oxide layer 12 may be created during this process step.

The result of the final exemplary steps of the array fabrication is shown in FIG. 4. A shallow blanket diffusion 5 of the same conductivity type as the substrate is made on the second surface of the substrate. This blanket diffusion may be made through the oxide layer 12 by ion implantation, or alternatively may be formed before the oxide coating is created. The surface enhancement of the diffusions 2 and 3 may be required, which step is well known in the industry. Then the contacts are opened on the first surface of the substrate to deposit and pattern metal to form the contact pads 20 and 21. In the final structure, the pads 20 have good electrical contact to the diffusion 3 and the pads 21 have good electrical contact to the diffusion 2.

Figure 6:
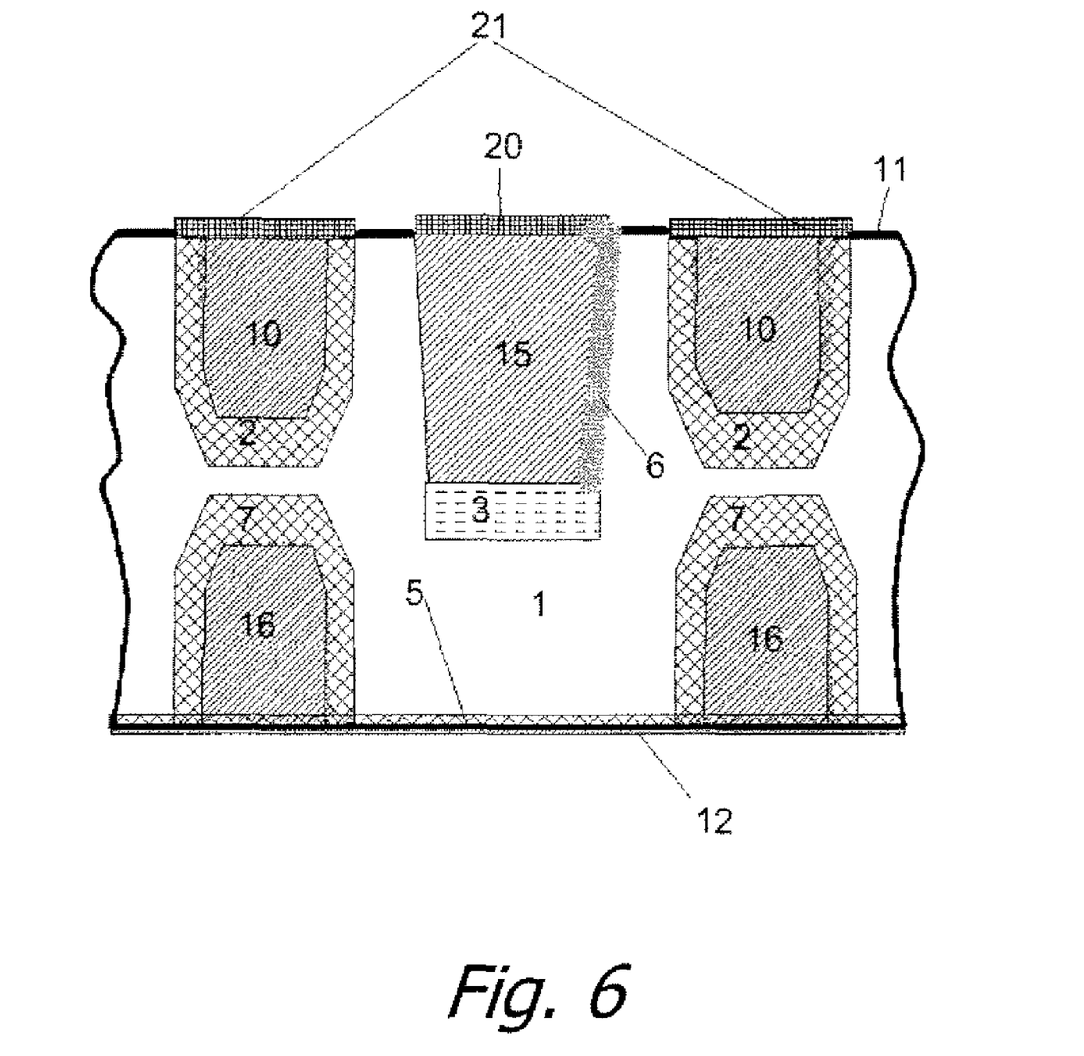
FIG. 6 shows the cross sectional view of an alternative structure with trenches formed from both surfaces of the substrate.

FIG. 6 shows another alternative structure of the backlit pin photodiode array with trench isolation. In this version, additional trenches are formed, and a second conductivity type diffusion 3 is made inside the trenches, preferably at their bottom as shown. A highly conductive path 6 (more conductive than the substrate) in each such trench that connects diffusion 3 with the first surface of the substrate is made, either with a high concentration diffusion of the second conductivity type applied to the wall of the trench, or with doped (the same conductivity type) poly, or by another method known in the industry. These trenches are then also backfilled with isolation material 15. The depth of the trenches 15 and the depth of the p/n junction (the bottom edge of the diffusion 3) are made as deep as is necessary to bring the bottom edge of the p/n junction within the approximately 200 um or less from the second surface of the substrate 1.

The structure of FIG. 6 also has trenches made from the second surface (backside) of the substrate. These trenches are aligned with the trenches on the first surface of the substrate. A first conductivity type diffusion 7 with a concentration heavier than that of the substrate is made inside the trenches on the second surface of the substrate. The trenches are then backfilled with isolation material 16, which could be the same as the material 10 used to backfill the trenches of the first surface of the substrate. The final drive is made with the purpose of minimizing the gaps between diffusions 2 and 7 (or to cause them to contact) and to bring the p/n junction between regions 3 and 1 closer than approximately 200 um from the second surface of the substrate. The blanket shallow diffusion 5 on the second surface of the substrate is applied when all drives are completed, which is similar to the case of the structure shown in FIG. 4. The metal pads 20 and 21 complete the structure. Note that wafer thinning may not be required for this structure.

Figure 7:
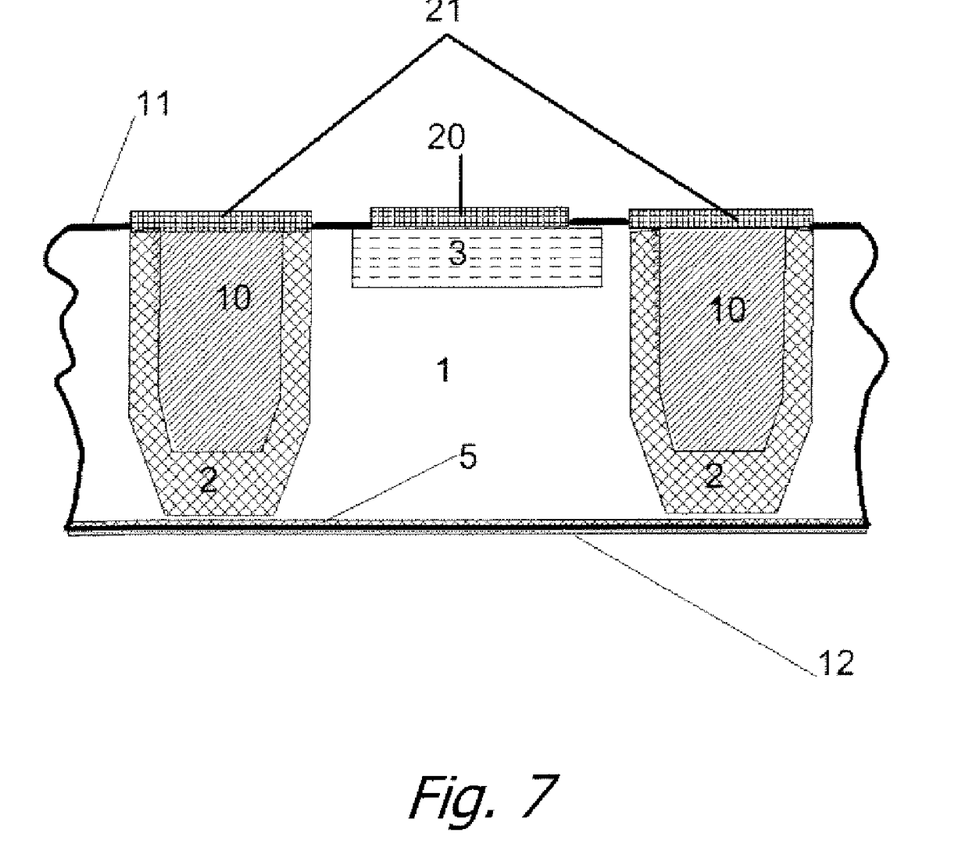
FIG. 7 shows the cross section of a structure of an embodiment of the present invention having the trenches on the first surface of the substrate and no isolation diffusion on the second surface of the substrate.

FIG. 7 shows still other embodiment of the array with isolating trenches. The structure of FIG. 7 is similar to the structure shown in FIG. 4, but no isolation diffusion is applied from the second surface of the substrate. Instead, the wafer thinning from the backside intercepts the isolation diffusion applied to the bottom of the trench on the first surface of the substrate. The structure of FIG. 7 is completed with the blanket doping deposition 5 on the second surface of the substrate and optional antireflection (AR) coating.

Figure 8:
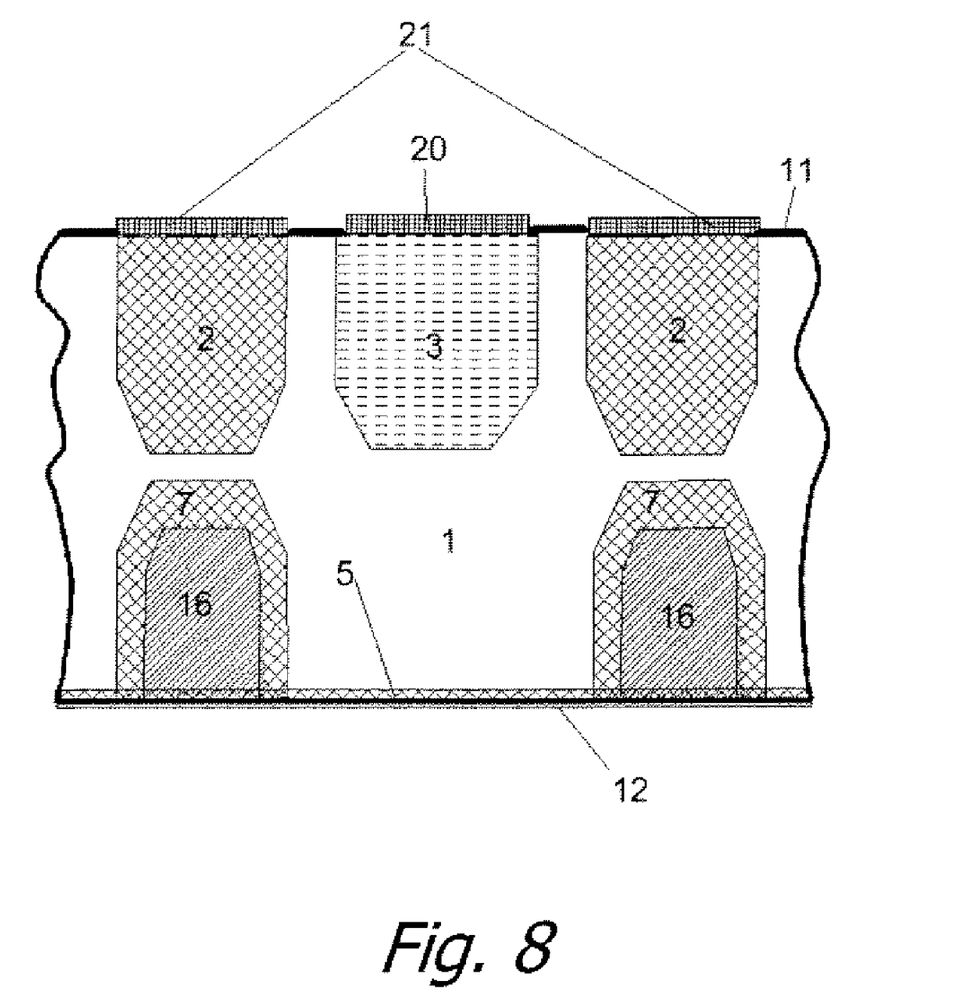
FIG. 8 is the cross section of an exemplary structure having the isolation trenches on the second surface of the substrate and isolation diffusion (no trenches) on the first surface of the substrate.

FIG. 8 shows still another version of an array with isolating trenches. The structure of FIG. 8 is similar to the structure shown in FIG. 6, but no trenches are made on the first surface of the substrate. Instead, the isolating diffusion 2 from the first surface of the substrate is driven as close as possible to the diffusion 7 applied inside trenches on the second surface of the substrate. Isolating diffusion 2 encloses (surrounds) each active pixel of the array. However, these two diffusions (diffusions 2 and 7) may, but do not necessarily meet. All diffusions (2, 3, and 7) may be driven simultaneously, providing the same depth for the isolation diffusion 2 on the first surface of the substrate and diffusion 7 on the second surface of the substrate. The thickness of the wafer can be, by way of example, from approximately 10 um up to approximately 300 um. The p/n junction depth on FIG. 8 (the depth of the diffusion 3 from the first surface of the substrate) is less than 300 um for a 300 um thick substrate, and may be close to the depth of the isolation diffusion 2 (this may be valid for the other alternative structures shown in FIGS. 4 through 7 as well). The p/n junction depth may be as deep as several tens of microns. Alternatively, diffusion 3 may be very shallow (from a few microns to several microns deep) and may be significantly shallower than the depth of the isolation diffusion 2.

As in all other versions of the structure, a blanket, shallow diffusion 5 is applied to the second surface of the substrate after all drives are completed.

Note that either n- or p-type substrate may be used for the embodiments and objectives throughout this disclosure.

The current invention presents alternative structures and methods of their preparation, which allow building pin photodiode arrays with superior performance parameters.

While certain preferred embodiments of the present invention have been disclosed and described herein for purposes of illustration and not for purposes of limitation, it will be understood by those skilled in the art that various changes in form and detail may be made therein without departing from the spirit and scope of the invention.

What is claimed is:
1. In a back-illuminated photodiode array, a device comprising:

a structure comprised of a semiconductor of a first conductivity type, having a first conductivity, and having first and second sides;

an array of photodiodes formed from the first side of the structure, each photodiode having a region of a second conductivity type with a concentration gradually decreasing towards the second side of the structure;

trenches in the semiconductor structure forming an interconnected matrix surrounding each photodiode, wherein the trenches extend from the second side of the structure;

the walls of the trenches doped with the first conductivity type to a second conductivity higher than the first conductivity;

the trenches being filled with electrical isolation material to provide electrical isolation between adjacent photodiodes; and a region of the first conductivity type proximate to the second side of the structure, the region having a third conductivity higher than the first conductivity.

2. The device of claim 1 wherein the trenches also extend from the first side of the structure.

3. The device of claim 2 further comprising a matrix of regions of the same conductivity type as the walls of the trenches and having higher concentration than the first concentration and extending from the second side of the structure, the said matrix of regions of the same conductivity type as the walls of the trenches also surrounding each photodiode and aligned with the interconnected matrix of trenches surrounding each photodiode.

4. The device of claim 1 further comprising a matrix of regions of the same conductivity type as the walls of the trenches and having higher concentration than the first concentration extending from the first side of the structure, the said matrix of regions of the same conductivity type as the walls of the etched trenches also surrounding each photodiode and aligned with the interconnected matrix of etched trenches surrounding each photodiode.

5. The device of claim 1 wherein the trenches extend from the first and second sides of the structure.

6. The device of claim 5 wherein the photodiodes are formed by a diffusion of the second conductivity type from the first side of the structure.

7. The device of claim 6 wherein the diffusion of the second conductivity type is below the first side of the structure.

8. The device of claim 7 further comprising a region more conductive than the substrate extending from the diffusion of the second conductivity type to the first side of the structure.

9. The device of claim 1 further comprising a blanket diffusion of the first conductivity type with a concentration heavier than the first concentration in the second side of the substrate.

10. The device of claim 9 further comprising an antireflective coating on the blanket diffusion of the first conductivity type.

11. The device of claim 1 wherein the structure has a thickness of approximately 300 um or less.

12. The device of claim 1 wherein the second conductivity and the third conductivity are equal.

\* \* \* \* \*